US005801988A

United States Patent [19]

Pascucci

[11] Patent Number: 5,801,988
[45] Date of Patent: Sep. 1, 1998

[54] CIRCUIT FOR THE GENERATION OF A VOLTAGE AS A FUNCTION OF THE CONDUCTIVITY OF AN ELEMENTARY CELL OF A NON-VOLATILE MEMORY

[75] Inventor: Luigi Pascucci, Sesto San Giovanni, Italy

[73] Assignee: SGS-Thomson Microelectronics S.r.l., Agrate Brianza, Israel

[21] Appl. No.: 835,031

[22] Filed: Mar. 27, 1997

[30] Foreign Application Priority Data

Mar. 29, 1996 [EP] European Pat. Off. .............. 96830168

[51] Int. Cl.$^6$ ........................................... G11C 16/06
[52] U.S. Cl. ..................... 365/185.21; 365/185.2; 365/189.09
[58] Field of Search ...................... 365/185.21, 185.2, 365/189.09, 189.07

[56] References Cited

U.S. PATENT DOCUMENTS

| 4,954,990 | 9/1990 | Vider ............................... 365/185 |
| 5,258,959 | 11/1993 | Dallabora ......................... 365/185.21 |
| 5,289,412 | 2/1994 | Frary ............................... 365/185.21 |
| 5,448,159 | 9/1995 | Kojima et al. ..................... 323/315 |
| 5,541,880 | 7/1996 | Campardo ........................ 365/189.09 |
| 5,621,686 | 4/1997 | Alexis ............................. 365/185.21 |

FOREIGN PATENT DOCUMENTS

WO-A-95 07536  3/1995  WIPO ................. G11C 16/06

*Primary Examiner*—David C. Nelms
*Assistant Examiner*—Son Mai
*Attorney, Agent, or Firm*—Wolf, Greenfield & Sacks, P.C.

[57] ABSTRACT

A circuit for the generation of a voltage as a function of the conductivity of an elementary cell, particularly for non-volatile memories, including a non-volatile element that is substantially identical to a generic cell of a memory matrix; a structure for biasing the drain terminal of the non-volatile element; a branch for sensing the current that flows through the non-volatile element; and a branch for mirroring the current sensed by the current sensing branch, the mirroring branch containing at least one transistor the gate terminal whereof is controlled by a first output voltage. The mirroring branch produces the first output voltage, the value whereof is a function of the current that flows through the non-volatile element and is sensed by the current sensing branch, and the biasing structure produces a second voltage that is substantially constant and is used as a reference voltage for the first voltage.

25 Claims, 6 Drawing Sheets

CIRCUIT FOR THE GENERATION OF A VOLTAGE AS A FUNCTION OF THE CONDUCTIVITY OF AN ELEMENTARY CELL OF A NON-VOLATILE MEMORY

BACKGROUND OF THE INVENTION

1. Field of the Invention

The present invention relates to a circuit for the generation of a voltage as a function of the conductivity of an elementary cell, particularly for non-volatile memories.

2. Discussion of the Related Art

In the construction of non-volatile memory cells, there are often circuit parts which require, for their correct operation, a close correlation to the conductivity of the elementary cell of the memory.

For example, in non-volatile memories using dynamic or latch data sensing structures, this correlation with the conductivity of the elementary cell is very important.

When such sensing structures are used, it becomes very important to be able to determine with certainty both the right moment for evaluating the data of the memory (for reading) and the subsequent timing to achieve data capture.

Generally, the evaluation step comes after an initial step of precharging certain nodes involved in the reading operation in order to bring said nodes to the active level and to stabilize the lines to which the memory cells are connected.

After the equalization step, these lines must be given the time to set themselves to the reading values, so as to allow correct data reading.

Using fixed timing by presetting beforehand a minimum wait time before reading the data has the drawback that it does not flexibly adapt to the dynamic characteristics of the various memory cells resulting from variation in supply voltages, operating temperatures, different technologies used in the execution of the cells, etc.

In particular, fixing the timing for the events linked to the reading of a memory cell penalizes both the case in which the cell has a low conductivity and the case in which it has a high conductivity.

When the cell has low conductivity in fact, the timing should be expanded, since greater certainty of the capture of the data item for reading is achieved with longer times than when a cell has higher conductivity.

Moreover, fixed timing does not take advantage of the higher conductivity of some cells since the possibility of shortening the read time of such a cell is not offered by the conventional circuitry.

This fixed timing of the various reading steps entails useless delays during reading, when the current flowing through the memory cell is high and it would be possible to shorten its reading, since certainty of data capture is achieved in a shorter time; timing must be based upon periods long enough to ensure cell reading even in the worst case for conductivity of said cell.

Another crucial problem for reading is the first reading operation, if it is performed in a transient state of the power supply, i.e., when the level of the supply voltage has not reached a steady state but reading is nonetheless attempted. This reading operation can occur too early, i.e., before reaching the nominal conductivity conditions of the non-volatile memory cell, which are notoriously higher than in normal CMOS devices, and therefore such a reading operation can be unreliable with no possibility of recovery.

SUMMARY OF THE INVENTION

An aim of the present invention is therefore to provide an improved memory circuit in which the functioning of the circuit adapts to changes in conductivity. The circuit allows generation of a first voltage and a second voltage, said first voltage acting as a reference for the second voltage, as a function of the conductivity of the elementary memory cell. The circuit is advantageously useful for non-volatile memories.

Within the scope of this aim, an object of the present invention is to provide a circuit for the generation of a voltage as a function of the conductivity of an elementary cell that allows to adapt the read timing of a memory cell to the conductivity of said cell.

Another object of the present invention is to provide a circuit for the generation of a voltage as a function of the conductivity of an elementary memory cell that allows to block the memory data reading stream if the memory cell fails to reach the conductivity conditions.

Another object of the present invention is to provide a circuit for the generation of a voltage as a function of the conductivity of an elementary memory call that allows to appropriately modulate the sensitivity of the sense amplifiers that capture the data from the memory cells.

Another object of the present invention is to provide a circuit for the generation of a voltage as a function of the conductivity of an elementary cell that allows to provide delays that are correlated to the conductivity of the cell.

Another object of the present invention is to provide a circuit for the generation of a voltage as a function of the conductivity of an elementary cell that can also be used in the presence of boost voltages.

Another object of the present invention is to provide a circuit for the generation of a voltage as a function of the conductivity of an elementary memory cell that allows to produce a reference voltage and a function of the conductivity of a memory cell, so as to generate, more generally, any delay function, level function, etcetera, correlated to the conductivity of the memory cell.

Another object of the present invention is to provide a circuit for the generation of a voltage as a function of the conductivity of an elementary memory cell that allows to configure a plurality of voltage states that are correlated to the conductivity and allow to provide a plurality of classes of performance for memory devices.

Another object of the present invention is to provide a circuit that is highly reliable and relatively easy to produce at competitive costs.

An embodiment of the invention may include a circuit for the generation of a voltage as a function of the conductivity of an elementary cell, particularly for non-volatile memories, characterized in that it comprises a non-volatile element that is substantially identical to a generic cell of a memory matrix; a structure for biasing the drain terminal of said non-volatile element; a branch for sensing the current flowing through said non-volatile element; and a branch for mirroring the current sensed by said current sensing branch, said mirroring branch containing at least one transistor the gate terminal whereof is controlled by a first output voltage, said mirroring branch producing said first output voltage, the value whereof is a function of the current flowing through said non-volatile element, sensed by said current sensing branch, said biasing structure producing a second voltage that is substantially constant and is used as a reference voltage for said first voltage.

BRIEF DESCRIPTION OF THE DRAWINGS

Further characteristics and advantages of the invention will become apparent from the description of a preferred but not exclusive embodiment of the device according to the invention, illustrated only by way of non-limitative example in the accompanying drawings, wherein.

DETAILED DESCRIPTION

Figure 1:
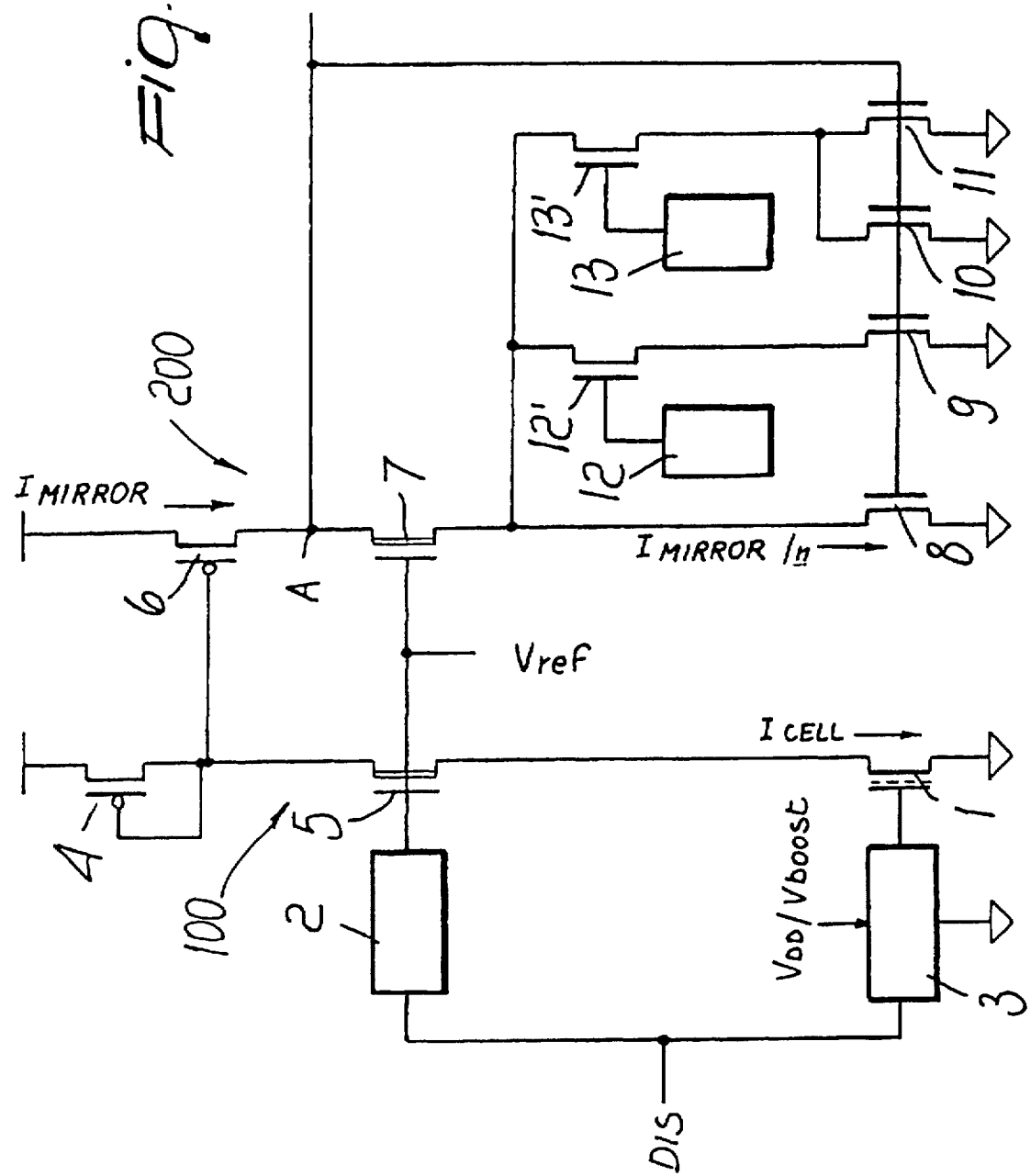
FIG. 1 is an exemplifying circuit diagram of a first embodiment of the circuit according to the invention.
Figure 3:
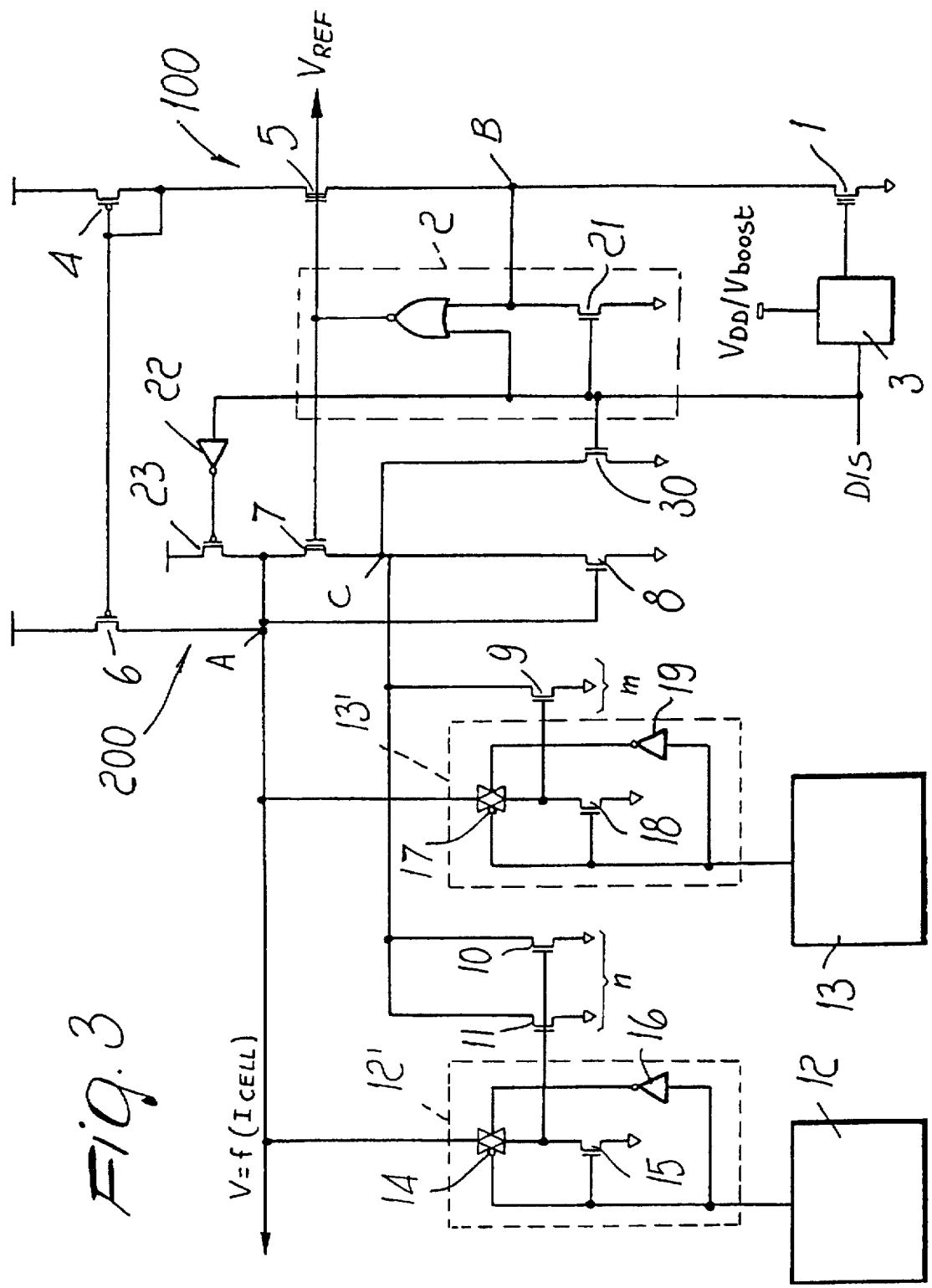
FIG. 3 is a detailed circuit diagram of the circuit shown in FIG. 1.

With reference to FIGS. 1 and 3, which illustrate a first embodiment of the circuit according to the invention, said circuit comprises: a conventional elementary cell 1, including a floating gate transistor; a branch 100 for "following" the current of the generic cell 1, the input side of a current mirroring circuit; a branch 200 for mirroring the current of the generic cell 1 carried in branch 100; means 2 for biasing the drain terminal of the elementary cell 1 through transistor 5; and level adapting means 3 for biasing the gate of the transistor of cell 1, using mixed supply voltages, i.e., when the circuit supply includes a boost voltage.

The elementary cell 1 is chosen among a matrix of cells, taking the central cell as sample so that it is fully identical to a generic memory cell.

The means 2 for biasing the drain terminal of the elementary cell 1 may, for example, comprise a cascode circuit.

In greater detail, a disable signal DIS is connected to an input to the means 2 and to an input to the level adapting means 3. The output of means 3 is connected to the gate terminal of the elementary cell 1.

The level adapting means 3, which comprises a booster circuit is supplied with respect to a circuit ground with a voltage that varies between the supply voltage $V_{DD}$ and the boost voltage.

The branch 100 for following the current Icell of the cell 1 (mirroring branch) comprises a first transistor 4 for sensing the current Icell of the cell 1, advantageously of the P-channel type, the source terminal whereof is connected to the supply voltage $V_{DD}$ and the drain terminal whereof is feedback-connected to the gate terminal and also connected to the drain terminal of a second biasing transistor 5, which is advantageously of the native low-threshold type.

The transistor 5 has its source terminal connected to the drain terminal of the elementary cell 1 and also receives, at its gate terminal, the output of the cascode structure 2.

The branch 200 for mirroring the current Icell of the elementary cell 1 in turn comprises a third transistor 6, advantageously of the P type, which is identical to the transistor 4 of the mirroring branch.

Said transistor 6 has its gate terminal connected to the drain terminal of the transistor 4, has its source terminal connected to the supply voltage $V_{DD}$, and has its drain terminal connected to the drain terminal of a fourth biasing transistor 7. Said biasing transistor 7 receives, at its gate terminal, the output of the cascode structure 2, and its source terminal is connected to a fifth transistor 8, the gate terminal whereof is controlled by an output voltage of the circuit V=f(Icell), which is a function of the current flowing through the elementary cell 1.

The voltage that is present on the gate terminal of the transistor 7, which is also a function of the cell current Icell, is used as reference voltage Vref=f(Icell).

The fourth transistor 7, like the transistor 5, is advantageously also a low-threshold native transistor.

Additional transistors 9, 10, and 11, all of which receive on their gates the output voltage of the circuit V=f(Icell), are programmable, by means of respective programming means 12 and 13, for example fuses, so as to lower the output voltage V=f(Icell) when turned on.

Said additional transistors 9, 10, and 11 are fully similar to the transistor 8 (of the N-channel type) and are connected as shown in FIG. 1.

Respective transistors 12' and 13' are connected to the fuses or other programming means 12 and 13.

FIG. 3 is a more detailed circuit diagram of FIG. 1.

In this figure, and in all subsequent figures, the same reference numerals used in FIG. 1 are assigned to identical elements.

In particular, FIG. 3 shows in detail the voltage adapting means constituted by a booster structure 3.

The individual transistors 12' and 13', shown in simplistic form in FIG. 1, may be embodied as the circuits 12' and 13' shown in FIG. 3.

The block 12' in FIG. 3 comprises a pair of pass transistors 14, formed by a P-type transistor and by an N-type transistor, and an N-channel transistor 15, the gate terminal whereof receives the output signal from the programming means 12 and the source terminal whereof is connected to the ground.

The pair of pass transistors 14 is connected to the voltage V=f(Icell) on one side and to the drain terminal of the transistor 15.

The output signal from the programming means 12 is connected to the gate terminal of the P-type transistor and, after being inverted by inverter 16, to the gate terminal of the N-type transistor of the pair of pass transistors 14.

Likewise, the block designated by 13' comprises the same elements as the above-described block 12'.

The elements of said block designated by 17, 18, and 19 correspond to the elements designated by 14, 15, and 16, respectively, in the block 12'.

The means 2 is shown in greater detail in FIG. 3. It comprises a NOR gate with two inputs. A first input of the NOR gate is connected to the enable/disable line DIS, whereas the second input is connected to the drain terminal of the elementary cell 1.

The output of the NOR gate is connected to the line that connects the gate terminals of the transistors 5 and 7 with a regulating function.

An N-type transistor 21 has its drain terminal connected to the second input of the NOR gate, has its source terminal connected to the ground, has its gate terminal connected to the line carrying the signal DIS.

Not shown in FIG. 1, but nevertheless present in the embodiment of FIG. 3, the disable/enable line DIS is furthermore input to an inverter 22, the output whereof drives the gate terminal of a P-channel transistor 23.

The transistor 23 has its source terminal connected to the supply voltage and has its drain terminal connected to the drain terminal of the transistor 7.

A further transistor 30, not shown in FIG. 1, but nevertheless present in the embodiment of FIG. 3, receives the signal DIS as an input to its gate terminal; its source terminal is connected to the ground and its drain terminal is connected to the line that connects the source terminal of the transistor 7 and the drain terminal of the transistor 8.

Figure 2:
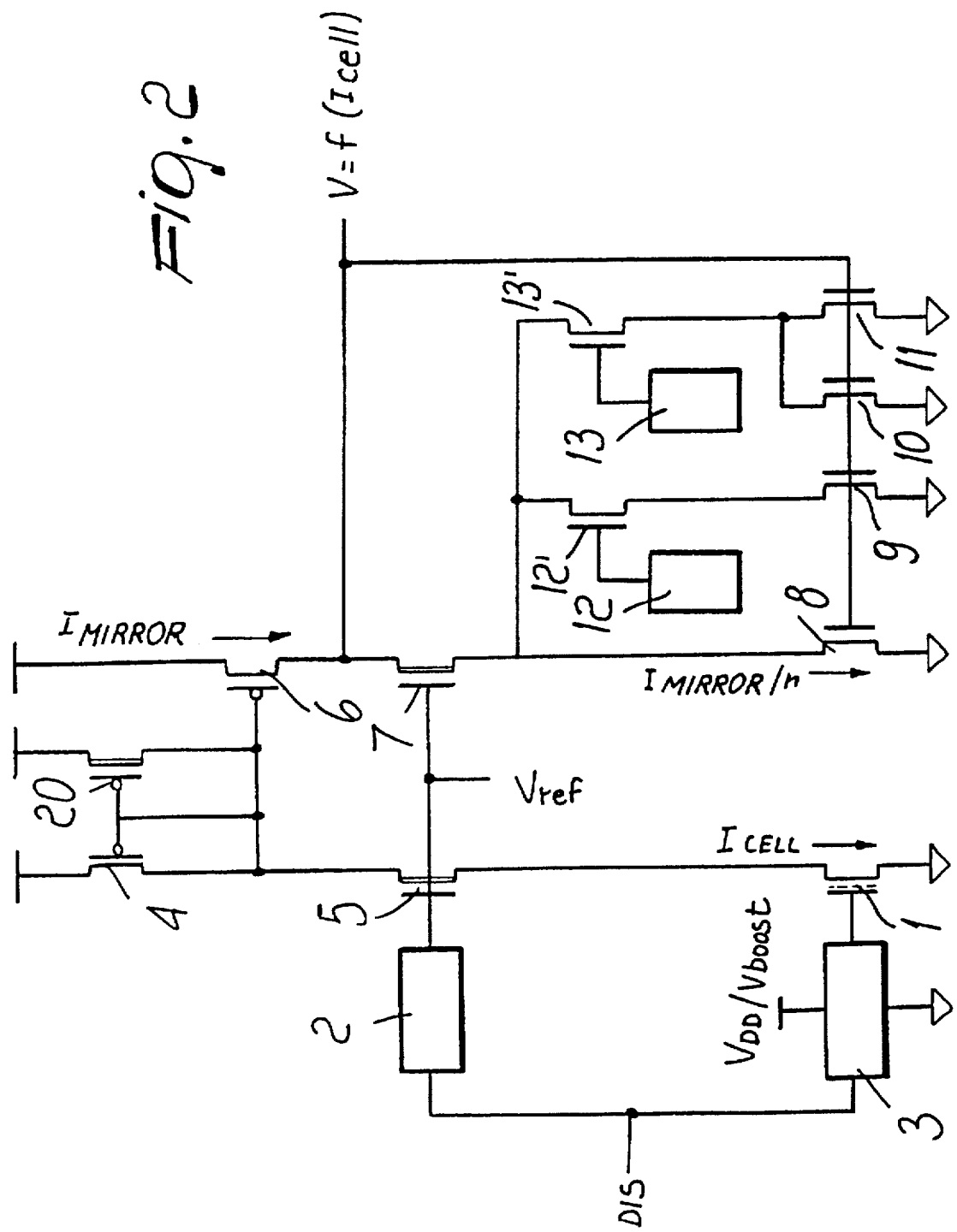
FIG. 2 is an exemplifying circuit diagram of a second embodiment of the circuit according to the invention.

FIG. 2 illustrates another embodiment of the circuit according to the invention, in which means for limiting the output voltage V=f(Icell) are provided. Said means comprise a P-channel transistor 20 of the native type with a high threshold (approximately 1.6 V). In said transistor 20, the source terminal is connected to the supply voltage $V_{DD}$, the gate terminal is connected to the gate terminal of the transistor 4 (and is therefore also connected to the drain terminal of the same transistor) and the drain terminal is connected to the gate terminal of the transistor 6.

Figure 4:
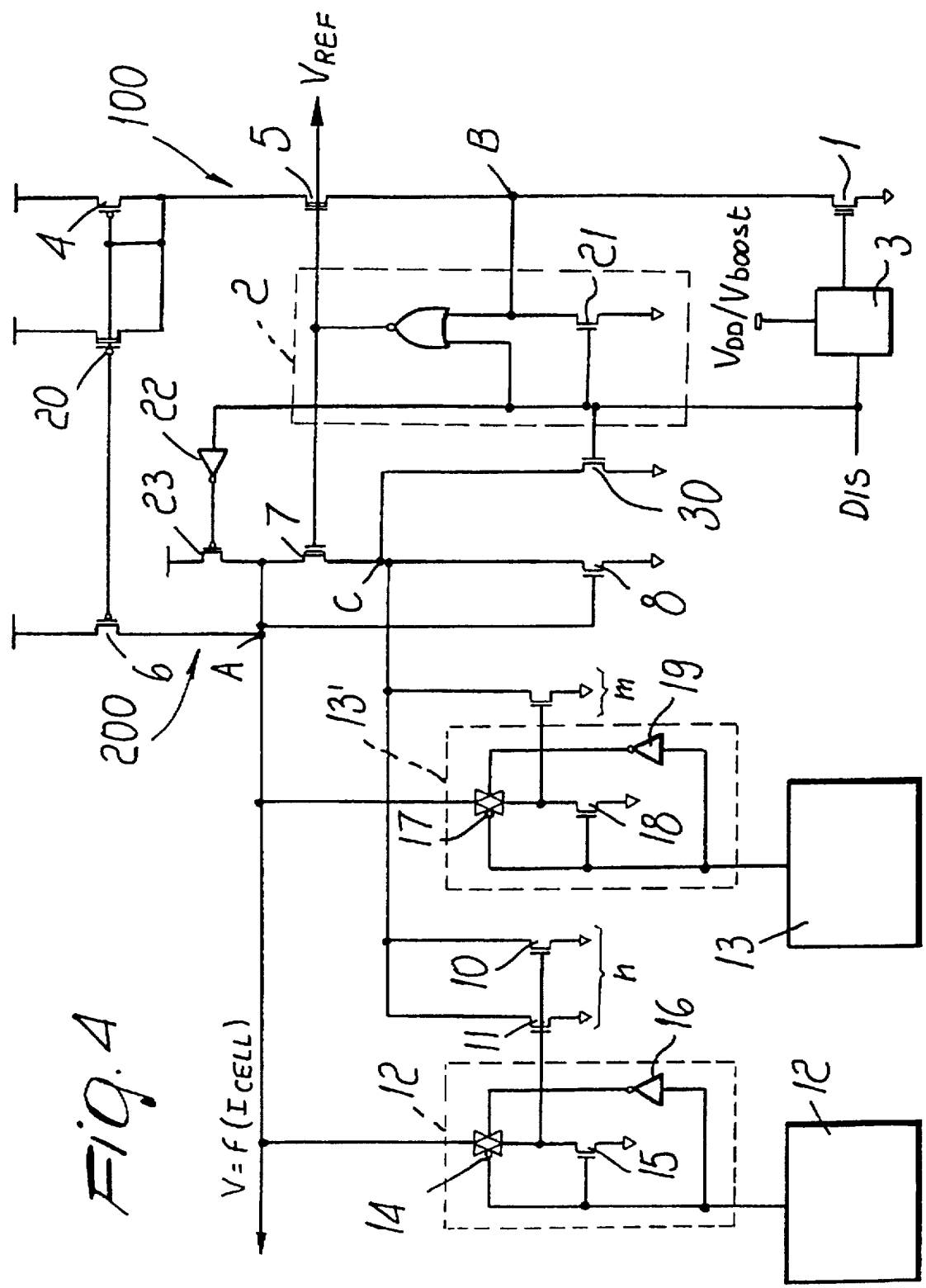
FIG. 4 is a detailed circuit diagram of the circuit shown in FIG. 2.

The insertion of the transistor 20 is also shown in FIG. 4, which illustrates in detail the circuit of FIG. 2. Therefore, the only difference between FIG. 3 and FIG. 4 is indeed constituted by the addition of this transistor 20.

Figure 5:
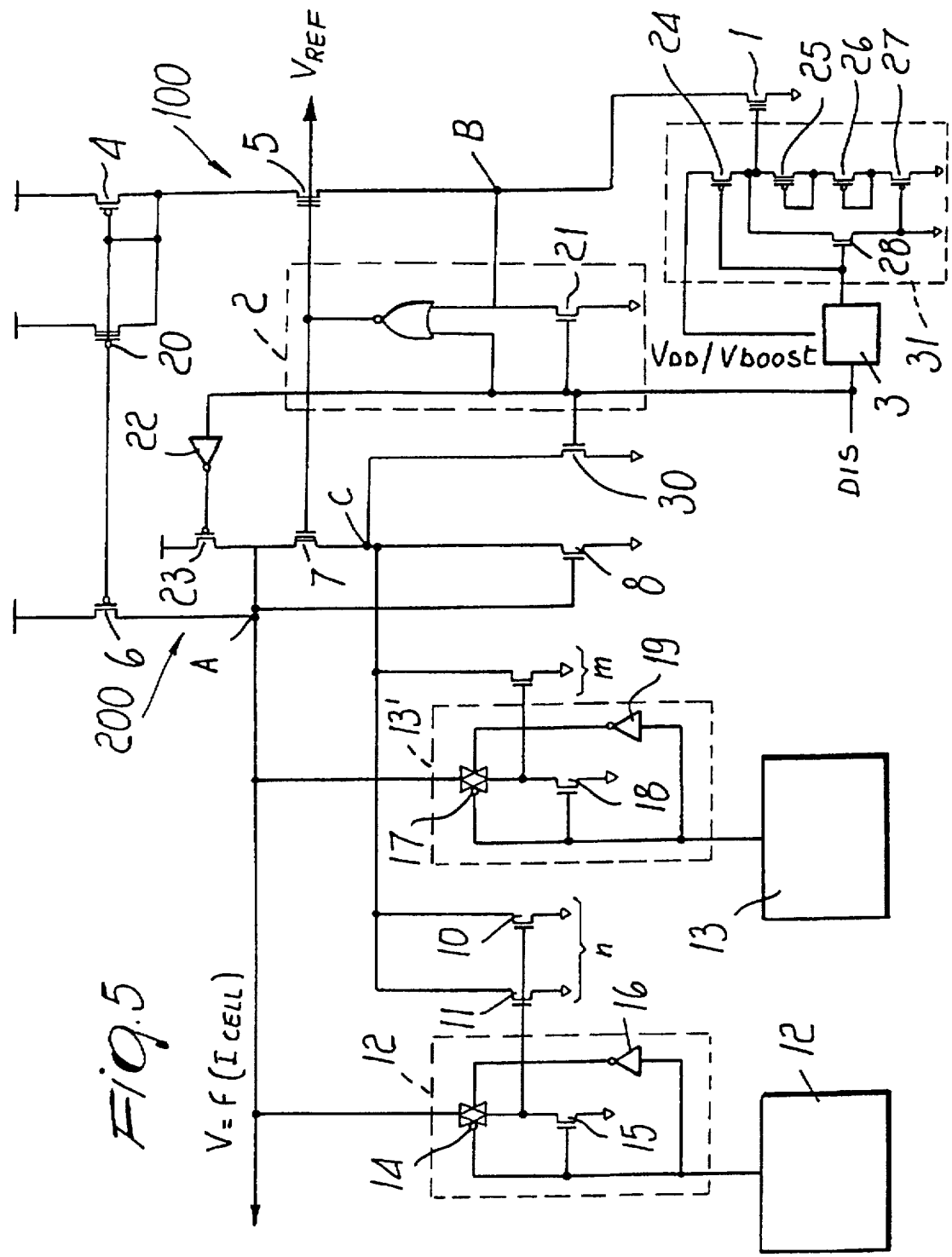
FIG. 5 is a detailed circuit diagram of a third embodiment of the circuit according to the invention.

FIG. 5 illustrates yet another embodiment of the circuit according to the invention, in which means 31 for limiting the supply voltage ($V_{DD}$/boost) input to the gate terminal of the elementary cell 1 are provided.

Said means 31 comprises four P-type transistors 24, 25, 26, and 27, which are connected between the supply voltage $V_{DD}$/boost and the ground; the drain terminal of each transistor is connected to the source terminal of the next transistor.

The drain terminal of the transistor 24 is connected to the gate terminal of the elementary cell 1.

The transistor 25 is of the native high-threshold type.

The gate terminal of the transistor 24 is connected to the output of the level adapting means 3, the gate terminal of the transistor 25 is connected to its drain terminal, the gate terminal of the transistor 26 is connected to its drain terminal, and the gate terminal of the transistor 27 is connected to the source terminal of a further fifth N-type transistor 28, the gate terminal whereof is connected to the output of the level adapting means 3.

The drain terminal of the transistor 28 is connected to the drain terminal of the transistor 24.

Figure 6:
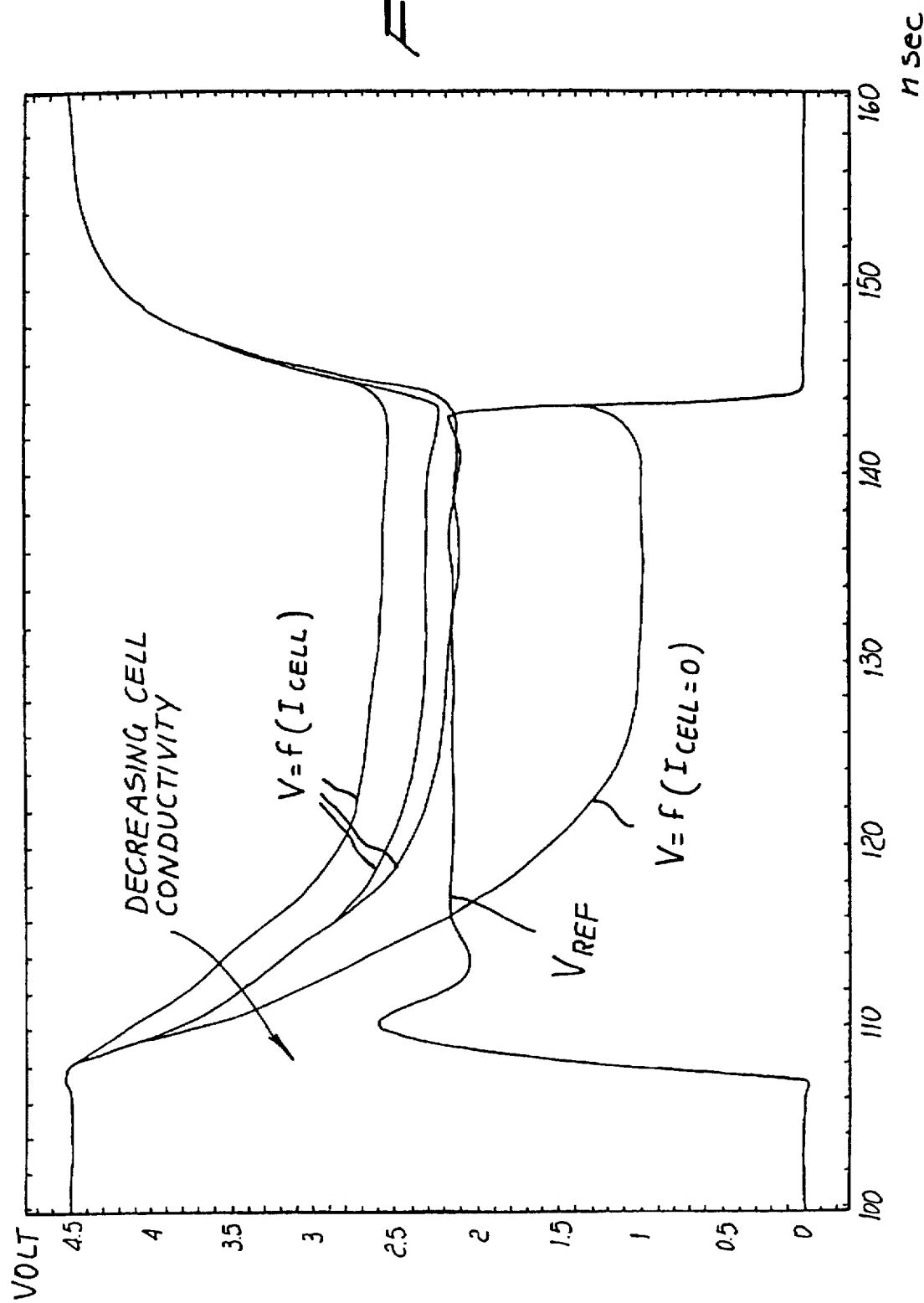
FIG. 6 is a chart plotting the voltages generated by the circuit according to the invention in case of different conductivity values of the elementary memory cell.

FIG. 6 plots the two voltages generated by circuits according to any of the embodiments illustrated herein in two different cases of conductivity of the elementary cell 1 and will be explained with reference to the operation of the circuit.

With reference to the above figures, and particularly to FIGS. 1 and 3, the operation of these exemplary embodiments of the invention is as follows.

When the signal DIS is high, the transistor 21 is on, the transistor 30 is on, and the transistor 23 is also on. Therefore, the node B is connected to the ground and the output of the NOR gate is low, the transistors 7 and 5 are off, and there is no flow of current, since the node C is also connected to the ground.

When the signal DIS changes from high to low, indicating the enabling of the circuit according to the invention, the condition is the opposite of the previous one: a voltage equal to the supply voltage that is present at that given time is supplied to the gate terminal of the cell 1. Therefore, the voltage supplied to the gate of cell 1 is either $V_{DD}$ or the boost voltage.

The means 2 (the NOR gate) and the transistor 5 bias the drain terminal of the cell 1, supplying said terminal with a voltage that is approximately equal to 1 V (node B).

At this point, a voltage equal to approximately 1 V plus a threshold voltage given by the threshold voltage of the transistor 5 is present at the gate terminal of the transistor 5.

Therefore, a current Icell determined by the voltage that is present at the gate terminal of the elementary cell 1 flows in said cell.

The P-channel transistor 4 delivers the current that the cell 1 requires according to the value of the voltage that is present at its gate terminal.

The transistor 4 then mirrors the value of the current Icell on the mirroring transistor 6 according to a preset mirroring ratio. The mirroring ratio can be smaller than, greater than, or equal to one, according to the requirements.

The current that flows in the transistor 8 at this point is therefore correlated to the mirroring ratio and is $I_{specchio}$/n, where n is the number of transistors similar to the transistor 8. If the transistor 8 is the only transistor that is on, the mirroring ratio is one.

The current $I_{specchio}$ is the current that flows through the transistor 6 and is a mirror copy of the current flowing in the transistor 4 that senses the conductivity of the elementary cell 1.

The node A thus reaches a voltage value that is correlated, according to the mirroring ratio, to the current flowing in the mirroring branch. An output voltage V=f(Icell) is thus obtained which is proportional to the current Icell that flows through the elementary cell 1.

If the mirroring ratio is 1:1, then the voltage level at the node A is such that the current of the mirroring branch is equal to the current that is present on the mirroring branch.

The voltage that is present at the gate terminal of the transistor 7 is substantially constant, and is scarcely affected by the variation in the conductivity of the elementary cell 1.

In this manner, there is a second output voltage that can be taken as reference voltage Vref, since it substantially depends on the supply voltage and not on the conductivity of the elementary cell 1.

If the transistors 9, 10, and 11 are also switched on because they are appropriately programmed, the mirroring ratio changes according to the number of said transistors that add themselves to the transistor 8.

The transistors 9, 10, and 11 are identical to the transistor 8 and receive, at their gate terminals, the output voltage V=f(Icell).

The number of these transistors is of course not restricted to three, as shown in FIG. 1, but in theory it is possible to have a number n of identical transistors; i.e., the mirroring ratio is n=1. . . m.

The voltage at the node A, by virtue of the switching on of additional transistors, decreases according to the number of on transistors, since the current that flows through the mirroring transistor 6 also flows in a number of transistors that can vary according to requirements.

The voltage V=f(Icell) can thus be configured through the appropriate switching on of transistors that are similar to the transistor 8.

Since the voltage V=f(Icell) is a function of the conductivity of the elementary cell 1 and can be modulated according to the number of transistors 9, 10, 11, . . . that are on, the output voltage of the circuit can be "centered" according to the operating requirements that said voltage must meet.

Since the transistors that determine the mirroring ratio are configurable once the number of said transistors that must be on has been determined and programmed, the output voltage V=f(Icell) is only a function on the conductivity of the memory cell 1.

With reference to the embodiment of the block 12' (and of the similar block 13') in FIG. 3, operation is as follows.

When the programming means 12 carries a high signal in input to the block 12', which indicates a virgin condition of the transistors, the P transistor of the pair of pass transistors 14 is off and so is the N transistor of said pair 14; the transistor 15 is instead on. In this manner, the transistors 10 and 11 (likewise for the transistor 9) are not enabled, i.e., the voltage V=f(Icell) does not reach their gate terminals, the current $I_{specchio}$ that is present on the mirroring branch 200 does not distribute in the branch of the two transistors 10 and 11 as well as transistor 8, and the voltage V=f(Icell) does not decrease.

However, if the programming means 12 (and 13) carry a low signal in input to the block 12' (and to the block 13'), the pair of pass transistors 14 is activated and the path to the ground provided by the transistor 15 is interrupted. In this case, the current $I_{specchio}$ also redistributes on the branch comprising the transistors 10 and 11, as well as transistor 8, and the output voltage V=f(Icell) decreases.

The transistors 9 and 10-11 can, as shown, be enabled separately or together according to the requirements, in order to lower the value of the voltage V=f(Icell) that can be obtained in output.

The transistor 8 sets the maximum value of the voltage V=f(Icell) that can be obtained in output, as a function of the conductivity of the elementary cell.

With reference to FIGS. 2 and 4, the means for limiting the output voltage V=f(Icell) constituted by the transistor 20 limits the output voltage when said voltage, which is a function of the conductivity of the cell 1, would be too high.

The transistor 20 modulates V=f(Icell) in a controlled manner.

Until the transistor 20 intervenes, the mirroring ratio between the transistors 4 and 6 is maintained. As the current increases, the transistor 20 intervenes, limiting the output voltage.

With reference to FIG. 5, the means 31 for limiting the supply voltage sets a maximum voltage value to be carried to the gate terminal of the elementary cell 1. Said value is set by the thresholds of the transistors 25, 26, and 27. In fact, when a low level is present in output from the voltage adapting means 3, the transistor 28 is off, the transistor 24 is on, and therefore the voltage at the gate terminal of the elementary cell 1 is limited by the thresholds of the transistors 25, 26, and 27.

The chart of FIG. 6 plots various behaviors of the output voltage V=f(Icell) with respect to the reference voltage Vref, as a function of the conductivity of the elementary cell 1. It is in fact evident that the output voltage V=f(Icell) differs increasingly from Vref as the conductivity of the elementary cell 1 increases or decreases.

The curves in the chart of FIG. 6, from the uppermost one to the lowermost one, represent decreasing values of cell conductivity.

The lowest curve represents the case in which the conductivity of the memory cell is zero and the voltage drops to the threshold of the transistor 8, which accordingly is not affected by any current.

In practice it has been observed that the circuit according to the illustrated embodiments of the invention generates, using an elementary memory cell, two voltages, one which is highly correlated to the conductivity of the cell.

The first voltage acts as reference for the second voltage and is intrinsically weakly dependent on the conductivity of the cell, whereas the second voltage is closely correlated to said conductivity.

These two voltages thus obtained can be used for example to optimize the timings of a data read cycle of a memory cell: the timings thus become dependent on the actual conductivity of the memory cell, overcoming the drawback of having to preset standard timings that can adapt to the different operating conditions so as to always ensure correct data reading.

These voltages obtained from the circuit according to the invention can furthermore be used to appropriately modulate the sensitivity of the sense amplifiers meant to capture the data for reading.

Finally, the possibility of having two voltages, one whereof is a reference voltage, linked to the conductivity of a memory cell, is useful in all those cases in which it is necessary to provide functions or operations that are closely correlated to the dynamics of a memory cell, including the suppression of the reading of the cell in case of zero conductivity thereof.

The circuit thus conceived is susceptible of numerous modifications and variations, all of which are within the scope of the inventive concept.

Thus, for example, the natural transistors 5 and 7 of the N type can be replaced with normal N-type transistors, LVS transistors, with a slightly higher threshold.

Finally, all the structures shown in detail may be replaced with other technically equivalent structures.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit for the generation of an output voltage as a function of conductivity of a non-volatile cell of a memory matrix, the cell having a gate terminal, a drain terminal and a source terminal, the circuit comprising:

a structure for biasing the drain terminal of said non-volatile cell;

a branch for sensing the current that flows through said non-volatile cell; and a branch for mirroring the current sensed by said current sensing branch, said mirroring branch containing at least one transistor having a gate terminal controlled by a first voltage produced by said mirroring branch, the value whereof is a function of the current that flows through said non-volatile cell, sensed by said current sensing branch, said biasing structure producing a second voltage that is substantially constant and is used as a reference voltage for comparison with said first voltage, the first voltage being the output voltage.

2. The circuit according to claim 1, further comprising means for adapting the level of the supply voltage for said non-volatile cell, said means for adapting being interposed between said non-volatile cell and ground.

3. The circuit according to claim 2, wherein said biasing structure and said means for adapting is driven by a disable signal.

4. The circuit according to claim 2, further comprising:
means for limiting the supply voltage to said non-volatile cell, said means for limiting being connected between said means for adapting the level of the supply voltage and said non-volatile cell.

5. The circuit according to claim 1, further comprising:
means for limiting said first voltage, connected between said current sensing branch and said mirroring branch.

6. The circuit according to claim 1, wherein said branch for sensing the current that flows through said non-volatile cell comprises a first transistor of a first polarity and a second transistor of a second polarity.

7. The circuit according to claim 6, wherein said first transistor of a first polarity has a source terminal connected to the supply voltage, a drain terminal connected to a drain terminal of said second transistor of a second polarity, and a gate terminal connected to a drain terminal of said second transistor of a second polarity.

8. The circuit according to claim 6, wherein said second transistor of a second polarity is driven, at its gate terminal, by said biasing structure and further wherein said second transistor has a source terminal connected to the drain terminal of said non-volatile cell.

9. The circuit according to claim 6, wherein said mirroring branch comprises a third transistor of a first polarity, a fourth transistor of a second polarity, and said at least one transistor, the gate terminal whereof is controlled by said first output voltage, said at least one transistor setting the maximum level of said output voltage.

10. The circuit according to claim 9, wherein said third transistor of a first polarity has a source terminal connected to the supply voltage, a gate terminal connected to the drain terminal of said first transistor, and a source terminal connected to a drain terminal of said fourth transistor.

11. The circuit according to claim 10, wherein said third transistor is of a size equal to that of said first transistor.

12. The circuit according to claim 10, wherein said fourth transistor has a gate terminal connected to the output of said means for adapting and, has a source terminal connected to the drain terminal of said at least one transistor, the gate terminal of said at least one transistor being controlled by said first output voltage.

13. The circuit according to claim 9, wherein said second and fourth transistors are native high-threshold transistors.

14. The circuit according to claim 1, further comprising:
a plurality of transistors that are identical to said at least one transistor, the gate terminals of said plurality of transistors being likewise controlled by said first output voltage, the plurality of transistors connected so as to lower said first output voltage as a function of a number constituting said plurality of transistors.

15. The circuit according to claim 14, wherein said plurality of transistors is driven by means for selectively enabling said plurality of transistors.

16. The circuit according to claim 5, wherein said means for limiting said first output voltage further comprises a transistor of a first polarity, of the native type, which has a high threshold, having a source terminal connected to the supply voltage, a drain terminal connected to said current sensing branch and to said mirroring branch, and a gate terminal connected to said current sensing branch.

17. The circuit according to claim 1, wherein said non-volatile cell is a floating-gate transistor of a second polarity.

18. The circuit according to any one of claim 12, wherein said transistors of a first polarity are P-channel transistors.

19. The circuit according to any one of claims 12, wherein said transistors of a second polarity are N-channel transistors.

20. The circuit according to claim 1, wherein said means for adapting receives as an input a voltage that can be switched between a supply voltage and a boost voltage.

21. A circuit for generating an output voltage which varies as a function of conductivity of a non-volatile memory cell, comprising:
means for receiving a current flowing through the memory cell;
means for copying at an output ratio the current received by the means for receiving, producing a mirror current; and
means for converting the mirror current to an output voltage, wherein the output voltage varies in correspondence with the mirror current.

22. The circuit of claim 21, further comprising:
means for producing a reference voltage against which the output voltage is compared; and
in the means for copying, means for varying the output ratio to obtain a desired relationship between the output voltage and the reference voltage.

23. A method for generating an output voltage which varies as a function of conductivity of a non-volatile memory cell, comprising the steps of:
receiving a current flowing through the memory cell;
copying at an output ratio the received current into a circuit branch; and
applying the copied current to a load in the circuit branch, whereby the output voltage appears across the load as a function of the copied current applied.

24. The method of claim 23, further comprising the steps of:
producing a reference voltage against which the output voltage is compared; and
varying the output ratio to obtain a desired relationship between the output voltage and the reference voltage.

25. The method of claim 23, further comprising the steps of:
receiving a disable signal; and
when the disable signal is asserted, forcing the output voltage to a disabled value.

* * * * *

UNITED STATES PATENT AND TRADEMARK OFFICE
CERTIFICATE OF CORRECTION

PATENT NO. : 5,801,988
DATED : September 1, 1998
INVENTOR(S): Luigi Pascucci

It is certified that error appears in the above-identified patent and that said Letters Patent is hereby corrected as shown below:

On the title page, item [73] should read:

[73] Assignee: SGS-Thomson Microelectronics S.r.l.
Agrate Brianza, Italy

Signed and Sealed this

First Day of December, 1998

Attest:

BRUCE LEHMAN

*Attesting Officer*  *Commissioner of Patents and Trademarks*